Dec. 6, 1966 H. LEYSIEFFER 3,290,618

FREQUENCY MODULATED TRANSISTOR OSCILLATOR

Filed Sept. 25, 1963 2 Sheets-Sheet 1

Dec. 6, 1966 H. LEYSIEFFER 3,290,618

FREQUENCY MODULATED TRANSISTOR OSCILLATOR

Filed Sept. 25, 1963 2 Sheets-Sheet 2

3,290,618

FREQUENCY MODULATED TRANSISTOR OSCILLATOR

Hans Leysieffer, Munich-Solln, Germany, assignor to Siemens & Halske Aktiengesellschaft, Berlin and Munich, Germany, a corporation of Germany Filed Sept. 25, 1963, Ser. No. 311,365
Claims priority, application Germany, Sept. 28, 1962, S 81,779
6 Claims. (Cl. 332—30)

The present invention relates to an oscillator, particularly a transistor oscillator which can be modulated in frequency by a modulating voltage, and to which a load is coupled in such a manner that the modulation characteristic is at least approximately linear in the operating region.

In order to produce frequency-modulated electromagnetic waves, it is known to connect a capacitance which is variable in synchronism with the modulation in parallel to the frequency-determining resonance circuit of a free-running oscillator. As such capacitance, there are frequently employed diode circuits, and recently also circuits with varactor diodes. The ordinary diode circuits operate either with a sort of resistance control of the diode which is connected in series with a fixed capacitor. A lesser or greater amount of capacitance is in this way additionally included in the resonance circuit. The efficiency obtainable thereby is, however, relatively slight; moreover, the Q (circuit Q) of the resonance circuit is undesirably reduced.

Another known method employs diodes for connecting to the parallel resonance circuit, in the manner of an operating angle control, a capacitance lying in series therewith. The corresponding circuit operates relatively linearly, but effects, referred to the center frequency of the oscillator, only a relatively small frequency swing. Accordingly, relatively complicated circuits which employ multiple frequency conversions are necessary in order to produce an electromagnetic wave which is angle-modulated with a relatively large frequency swing. By angle modulation is understood any modulation of an electromagnetic wave in frequency or phase.

The object of the present invention is to construct with relatively slight expenditure an angle-modulated oscillator which can be frequency-modulated linearly in a wide region as a function of a modulating voltage.

Starting from an oscillator, and in particular a transistor oscillator which can be modulated in frequency by a modulating voltage and to which a load is so coupled that the modulation characteristic is at least approximately linear in the operating region, this object is achieved in accordance with the invention by including in the frequency-determining resonance circuit of the oscillator, a capacitance which varies in synchronism with the modulation and has a capacitance characteristic which corresponds to that of a varactor diode, and connecting an ohmic resistance to said resonance circuit by way of a series resonance circuit, the tuning of which above the highest operating frequency and the circuit Q of which, with inclusion of the resistance, is selected so low that the modulation characteristic is linear in the operating region. The ohmic resistance advantageously forms the load to be connected to the oscillator.

The series resonance circuit is advantageously connected stepped-down to the parallel resonance circuit of the oscillator. This affords the additional possibility of using the scattered inductance of the coil of the parallel resonance circuit at least in part as inductance of the series resonance circuit.

Moreover, it has proven advantageous to provide in parallel to the parallel resonance circuit two varactor diodes connected serially in opposition and to feed the modulating voltage in parallel to these varactor diodes. It is in such case advantageous that this variable capacitance forms substantially the entire capacitance of the frequency-determining parallel resonance circuit.

It is as such known, in connection with reflex klystron oscillators, to linearize the modulation characteristic which in itself is not linear, by coupling to the reflex klystron the load in a special manner, dependent on frequency. However, aside from other essential differences, there are not applied either a series resonance circuit or its special tuning and dimensioning of the Q of the circuit.

Further details and features of the invention will appear from the description of an embodiment thereof which is rendered below with reference to the accompanying drawings.

FIG. 1 shows a transistor oscillator circuit;

FIG. 2 indicates modulation characteristics;

Figure 6:
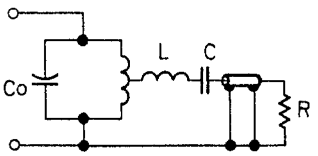

FIG. 6 indicates the dipole connected to a tap of the oscillation circuit; and

Figure 7:
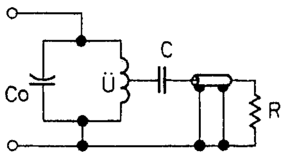

FIG. 7 shows the circuit according to FIG. 6 with the inductance omitted.

Figure 1:
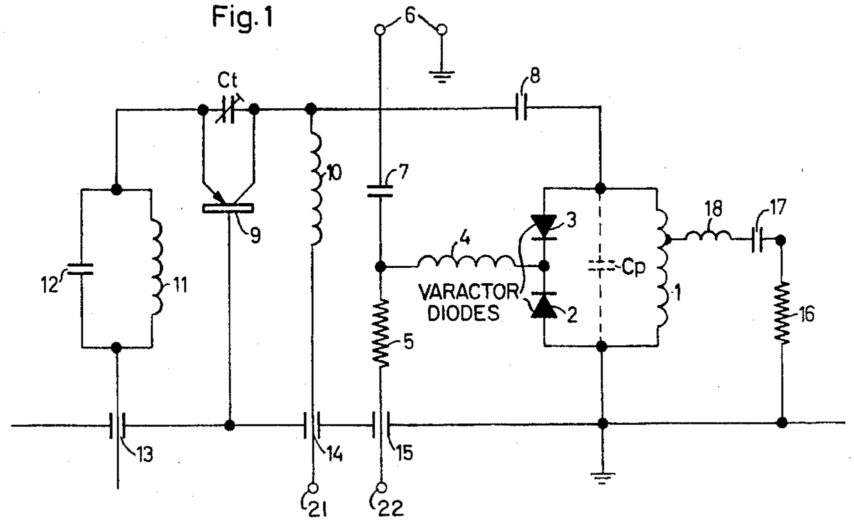

The transistor oscillator shown in FIG. 1 comprises a transistor 9 which is operated in base circuit and in the output of which is provided a parallel resonance circuit including an inductance 1 with a parallel capacitance $C_p$ which includes the capacitive effect of the parallel-connected varactor diodes 2, 3 which lie in series opposition and may also include an additional capacitor. The parallel resonance circuit 1, 2, 3, $C_p$ is connected by way of a coupling capacitor 8 of sufficiently high value, with the collector of the transistor, which is fed with direct current by way of a choke 10. The operating-voltage applied to terminal 21 is, from the standpoint of alternating current, decoupled from the reference potential by a capacitor 14. Since there is concerned an oscillator circuit similar to a Huth-Kuhn oscillator, another parallel resonance circuit including the inductance 11 and a capacitance 12 lies in the emitter circuit of the transistor 9. The emitter curent is fed by way of the inductance 11. The end of the parallel resonance circuit facing away from the emitter is for this reason connected with the reference potential of the oscillator by way of the lead-through capacitor 13 only from an alternating current standpoint. Only the base of the transistor lies directly at reference potential. An additional variable capacitor $C_t$ is provided between emitter and collector of the transistor 9 in order to assure good feedback. The tuning of the circuits is effected in the manner known from Huth-Kuhn oscillators.

The feeding of the modulating voltage is effected between the varactor diodes 2, 3 by way of an inductance 4 serving for high frequency throttling. A bias voltage, applied to terminal 22 is by way of this inductance and the resistor 5 and the blocking capacitor 15 fed to the varactor diodes 2, 3, while the feeding of the modulating voltage with respect to the reference voltage takes place by way of the terminal 6 and the capacitor 7.

The capacitor 7 is for this purpose as to its capacitance so dimensioned that the modulating frequencies pass practically unattenuated to the varactor diodes. The resistor 5 also forms the terminating resistance for the modulating voltage lead 6. The blocking capacitor 15 has for this reason such a high value that it practically forms a short-circuit even for the lowest modulating frequencies occurring.

In accordance with the invention, the load 16 is by way of a series resonance circuit containing the inductor 18 and the capacitor 17 connected to a tap of the coil 1 at the output-side of the parallel resonance circuit of the transistor oscillator.

The oscillator operates, for example, in a range around 240 megacycles. Let us assume that the required maximum frequency swing (displacement) amounts at this center frequency, for instance, to ±3 megacycles. The series resonance circuit 17, 18 in which there is also included, from the tuning standpoint, a part of the scattering inductance of the coil 1 which forms a sort of auto-transformer, is tuned in accordance with the invention to above the highest operating frequency, and therefore, to a frequency lying above 243 megacycles. In the embodiment shown by way of example, this frequency was selected at about 310 megacycles. Furthermore, the Q of the circuit, which is determined in part by the load 16, was selected so low that there is obtained a practically linear modulation characteristic within a maximum frequency displacement of ±3 megacycles. As usable value for the circuit Q, there was found under these conditions a loaded circuit Q of about 1 to 2.

Figure 4:
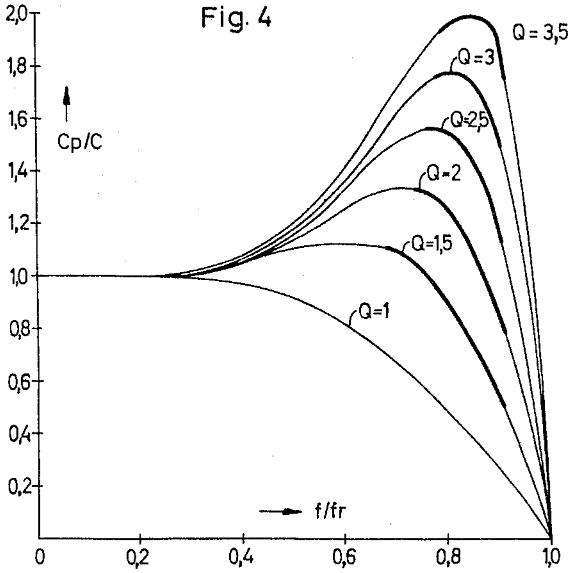
FIG. 4 shows curves indicating among others the action of the dipole according to FIG. 3.
Figure 3:
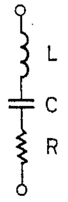
FIG. 3 represents a dipole with a series resonance frequency which exceeds the operating range of the modulation oscillator.
Figure 5:
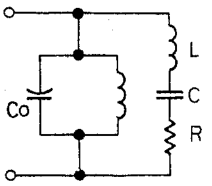
FIG. 5 illustrates a network connected in parallel to the oscillation circuit of the modulation oscillator.
Figure 2:
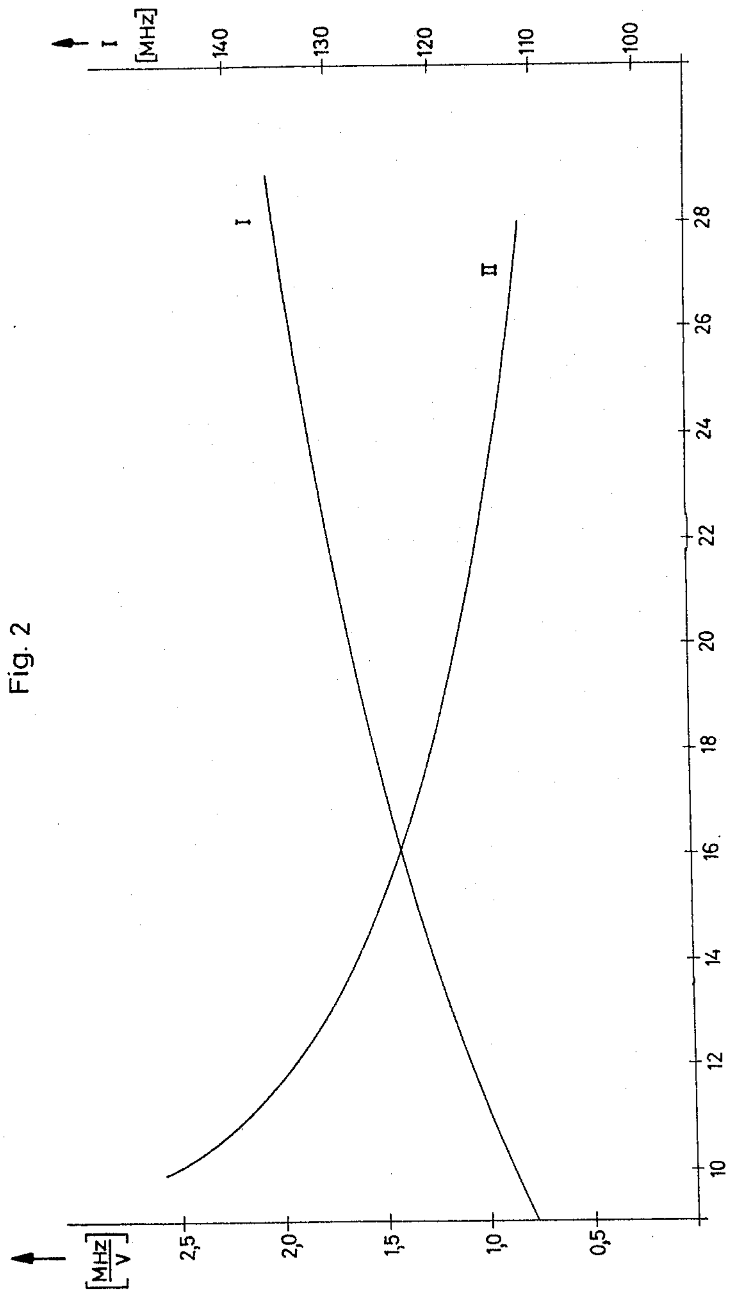

The manner of operation of the embodiment described can be comprehended approximately as follows:

Upon considering the typical modulation characteristic of a varactor-controlled, single-oscillator (FIG. 2, curve I), it will be seen that it becomes more linear when, in case of higher varactor bias voltages, the oscillatory-circuit capacitance drops more rapidly than is the case. Curve II of FIG. 2 shows the steepness of the tuning in megacycles (MHz.) per volt of the circuit according to the present invention. This can be achieved in accordance with the invention, by the parallel connection of a frequency-dependent capacitance which becomes smaller at higher frequencies. This property is present, for instance, in the case of a dipole, in accordance with FIG. 3, the series-resonance frequency of which is higher than the operating region of the modulation oscillator. Below this resonance, the dipole acts as capacitance; this capacitance $C_p$ is plotted in FIG. 4, standardized to the series circuit capacitance C, dependent upon the standarized frequency $f/fr$, wherein $f_r$ is the resonance frequency of the series circuit. The Q of the series circuit acts thereby as parameter, defined as the ratio of the capacitive resistance of C at the frequency $f_r$ and the ohmic resistance R. It can be seen that this network provides, in given frequency ranges, a falling frequency response of the capacitance. The desired increase in the linearity can therefore be obtained upon connecting such a network, as shown in FIG. 5, in parallel to the oscillatory circuit of the modulation oscillator (FIG. 5). Regions for optimum linearity are shown in heavy line in FIG. 4. Upon connecting the dipole to a tap of the oscillatory circuit as shown in FIG. 6, the resistance R will in the case of optimum linearization, assume the value of customary cable characteristic impedances, thus serving as the load resistance (impedance) of the oscillator. At frequencies in the ultra-short wave region, the inductance L can be frequently dispensed with in the circuit, as indicated in FIG. 7, since it can be formed by the scattering or leakage inductance of the transformer Ü.

The invention is of particular importance in connection with modulators for directional radio links which operate with frequency modulation. In recent systems of this type, there are in part supplied extremely wide base-band frequency bands which are to be converted as linearly as possible into a frequency modulation of the radio-frequency carrier oscillation. The modulation circuit in accordance with the invention performs in such cases particular services, since it makes it possible to bring a base-band containing, for instance, the intelligence of 300 telephone channels, as angle modulation, into an already relatively high frequency position. Such requirements are frequently present in the case of relay stations of directional radio links in which a bundle of channels is to be additionally introduced into ranges which are kept free for such purposes. The oscillator of the invention is primarily intended for such purposes.

Changes may be made within the scope and spirit of the appended claims which define what is believed to be new and desired to have protected by Letters Patent.

I claim:

1. An oscillator having a frequency-determining resonant circuit and a feedback coupling path which can be modulated in frequency by a modulating voltage comprising, capacitor means disposed in the frequency-determining resonant circuit of the oscillator which is connected to and variable in synchronism with the modulating voltage and has a capacitance characteristic corresponding to varactor diodes, a resistor, a series resonant circuit, means including said series resonant circuit for connecting said resistor to said frequency-determining resonant circuit externally of said feedback coupling path of the oscillator, the tuning of said series resonant circuit above the highest operating frequency and the circuit Q thereof, with inclusion of said resistor, being so low that the modulation characteristic is linear in the operating region.

2. An oscillator according to claim 1, wherein said resistor forms a load for the oscillator.

3. An oscillator according to claim 1, wherein the connection of said series resonant circuit to the first named resonant circuit is in the form of a step-down circuit.

4. An oscillator according to claim 3, wherein said frequency-determining resonant circuit is a parallel resonant circuit and includes a coil having a tap and said series resonant circuit is connected to the tap of the coil of the parallel resonant circuit, at least a part of the inductance of said series resonant circuit being formed by the scattering inductance of said coil.

5. An oscillator according to claim 1, wherein said frequency-determining circuit is a parallel resonant circuit and said capacitor means includes two serially disposed oppositely acting varactor diodes connected parallel to the parallel resonant circuit, and means for feeding the modulating voltage in parallel to said varactor diodes.

6. An oscillator according to claim 1, wherein said frequency-determining circuit is a parallel resonant circuit and the variable capacitor means forms substantially the entire capacitance of the frequency determining parallel resonant circuit.

References Cited by the Examiner

UNITED STATES PATENTS

| | | | |
|---|---|---|---|
| 2,984,794 | 5/1961 | Carter et al. | 332—30 |
| 3,068,427 | 12/1962 | Weinberg | 332—26 X |
| 3,154,753 | 10/1964 | Rusy | 332—26 |
| 3,156,910 | 11/1964 | Tarbutton | 332—30 |

ROY LAKE, *Primary Examiner.*

A. L. BRODY, *Assistant Examiner.*